(12) United States Patent
Henderson

(10) Patent No.: US 11,665,855 B2
(45) Date of Patent: May 30, 2023

(54) SCALABLE GRAPHICS CARD ASSEMBLY SUPPORT SYSTEM

(71) Applicant: Dell Products L.P., Round Rock, TX (US)

(72) Inventor: Gregory L. Henderson, Round Rock, TX (US)

(73) Assignee: Dell Products L.P., Round Rock, TX (US)

( * ) Notice: Subject to any disclaimer, the term of this patent is extended or adjusted under 35 U.S.C. 154(b) by 85 days.

(21) Appl. No.: 17/446,857

(22) Filed: Sep. 3, 2021

(65) Prior Publication Data
US 2023/0077052 A1 Mar. 9, 2023

(51) Int. Cl.
*H05K 7/20* (2006.01)
*H05K 7/14* (2006.01)
*G06F 1/18* (2006.01)
*G06F 1/20* (2006.01)

(52) U.S. Cl.
CPC ......... *H05K 7/20272* (2013.01); *G06F 1/181* (2013.01); *G06F 1/189* (2013.01); *G06F 1/20* (2013.01); *H05K 7/1417* (2013.01); *H05K 7/20136* (2013.01)

(58) Field of Classification Search
CPC ............. H05K 7/20272; H05K 7/1417; H05K 7/20136; G06F 1/181; G06F 1/189; G06F 1/20

See application file for complete search history.

(56) References Cited

U.S. PATENT DOCUMENTS

| | | | | |
|---|---|---|---|---|
| 6,396,690 B1 * | 5/2002 | Blatti | ...................... | G06F 1/184 439/631 |
| 6,462,959 B1 * | 10/2002 | Fu | ........................... | G06F 1/185 248/225.11 |
| 6,788,533 B2 * | 9/2004 | Chen | .................. | H05K 7/20172 361/679.48 |
| 8,243,460 B2 * | 8/2012 | Searby | ................... | G06F 1/185 361/810 |
| 8,824,157 B2 * | 9/2014 | Fan | ........................ | G06F 1/186 361/740 |
| 9,261,923 B2 * | 2/2016 | Farrow | .................. | G06F 1/183 |
| 9,765,924 B2 * | 9/2017 | Chi | .......................... | G06F 1/188 |
| 9,939,856 B1 * | 4/2018 | Wu | ........................ | G06F 1/183 |
| 10,185,371 B1 * | 1/2019 | Godfrey | ................. | G06F 1/187 |

(Continued)

*Primary Examiner* — Stephen S Sul
(74) *Attorney, Agent, or Firm* — McDermott Will & Emery LLP

(57) ABSTRACT

A scalable graphics card assembly support system for a desktop chassis comprises an end support for coupling to an end of a graphics card assembly and a side support for coupling to a side of the card assembly. The side support can be coupled to any of several positions in a retention guide and the end support may couple to the card assembly or an extension coupled to the graphics card assembly, allowing the graphics card assembly support system to support graphic card assemblies of different lengths, widths and thicknesses. The graphics card assembly support system couples to one or more selected points within the chassis such that a chassis panel can be easily removed for servicing the information handling system. Cable parking connectors and conduit couplers provide better cable and conduit management for a more aesthetically pleasing appearance of an information handling system in the chassis.

17 Claims, 7 Drawing Sheets

(56) References Cited

U.S. PATENT DOCUMENTS

| | | | |
|---|---|---|---|
| 10,251,298 B1* | 4/2019 | Lin | G06F 1/20 |
| 2002/0041484 A1* | 4/2002 | Lajara | G06F 1/20 |
| | | | 361/679.48 |
| 2004/0174687 A1* | 9/2004 | Wang | H05K 7/1408 |
| | | | 361/801 |
| 2008/0180896 A1* | 7/2008 | McClure | G06F 1/184 |
| | | | 361/727 |
| 2011/0194243 A1* | 8/2011 | Yang | G06F 1/20 |
| | | | 361/679.48 |
| 2012/0020016 A1* | 1/2012 | Cheng | G06F 1/184 |
| | | | 361/679.48 |
| 2015/0277514 A1* | 10/2015 | Farrow | G06F 1/186 |
| | | | 361/679.31 |
| 2017/0344078 A1* | 11/2017 | Abdul-Razzak | G06F 1/20 |
| 2022/0221920 A1* | 7/2022 | Shabbir | G06F 1/20 |

* cited by examiner

SCALABLE GRAPHICS CARD ASSEMBLY SUPPORT SYSTEM

BACKGROUND

Field of the Disclosure

This disclosure relates generally to information handling systems and, more particularly, to systems for supporting graphics card assemblies in a chassis of an information handling system.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Some information handling systems are assembled in desktop chassis that have a fan located on a first side and a vent located on a second side opposite the first side. Some components are positioned in the airflow to increase heat transfer from the component to the airflow and facilitate heat transfer out the chassis to the ambient environment. Graphic cards are an example of a component that generate significant heat, and which benefit by positioning in an airflow. Graphics cards may form part of a graphics card assembly comprising a printed circuit board (PCB) with a graphics processing unit (GPU) and components associated with the GPU.

SUMMARY

Embodiments disclosed herein may be directed to a scalable graphics card assembly support system capable of supporting a graphics card assembly at one or more of a top or end of the card.

A chassis of an information handling system comprises a fan positioned on a first side and configured for generating an airflow through the chassis to a vent on a second side opposite the first side and a removable panel. A graphics card assembly support system for a chassis of an information handling system may comprise an end support, a side support and a retention guide. The end support may be configured for engaging a fan and comprises a slot for receiving a first end of a graphics card assembly and a plurality of channels for directing the airflow from the fan along the length of the graphics card assembly. The side support may be configured for engaging the graphics card assembly at a position along the length of the graphics card assembly. The retention guide comprises a plurality of retention openings for detachable coupling with the side support at a retention opening of the plurality of retention openings and is configured for attaching to the chassis.

A scalable graphics card assembly support system that includes provisions for supporting the card both on the top and at the end uses tool-less end supports and side supports that can be used independently or in conjunction with each other, depending on the size and mass of the card.

For full-length air-cooled cards (or cards that include an extender to make the card full-length), the end support can be used independently from the side support to provide maximum flexibility on card height and width.

For shorter graphics card assemblies that do not accommodate extenders or for liquid-cooled cards that do not allow use of the end support, the side support can be used independently from the end support.

For graphics card assemblies with extremely high mass, both supports can be used in conjunction with each other to provide additional support and redundancy.

To account for variances in thermal solution implementations amongst various types of graphics card assemblies (e.g., dual axial fans, triple axial fans, blowers, etc.), the side support can be moved to multiple positions along the length of the card and can also be adjusted to account for width variances. The side support can also accommodate different card thicknesses via a removable adapter.

The side support can be used to provide features for retaining and guiding liquid cooling tubes or provide cosmetic enhancements such as brand logos or other artwork.

The retention system also includes integrated cable management features for cables that include the ability to "park" up to four cables.

Embodiments allow multiple variations and configurations for retaining a graphics card assembly that can be used independently or together to accommodate a variety of card heights, widths, lengths, weights and both air- and liquid-cooling components.

BRIEF DESCRIPTION OF THE DRAWINGS

For a more complete understanding of the invention and its features and advantages, reference is now made to the following description, taken in conjunction with the accompanying drawings, in which.

DESCRIPTION OF PARTICULAR EMBODIMENT(S)

Figure 1:
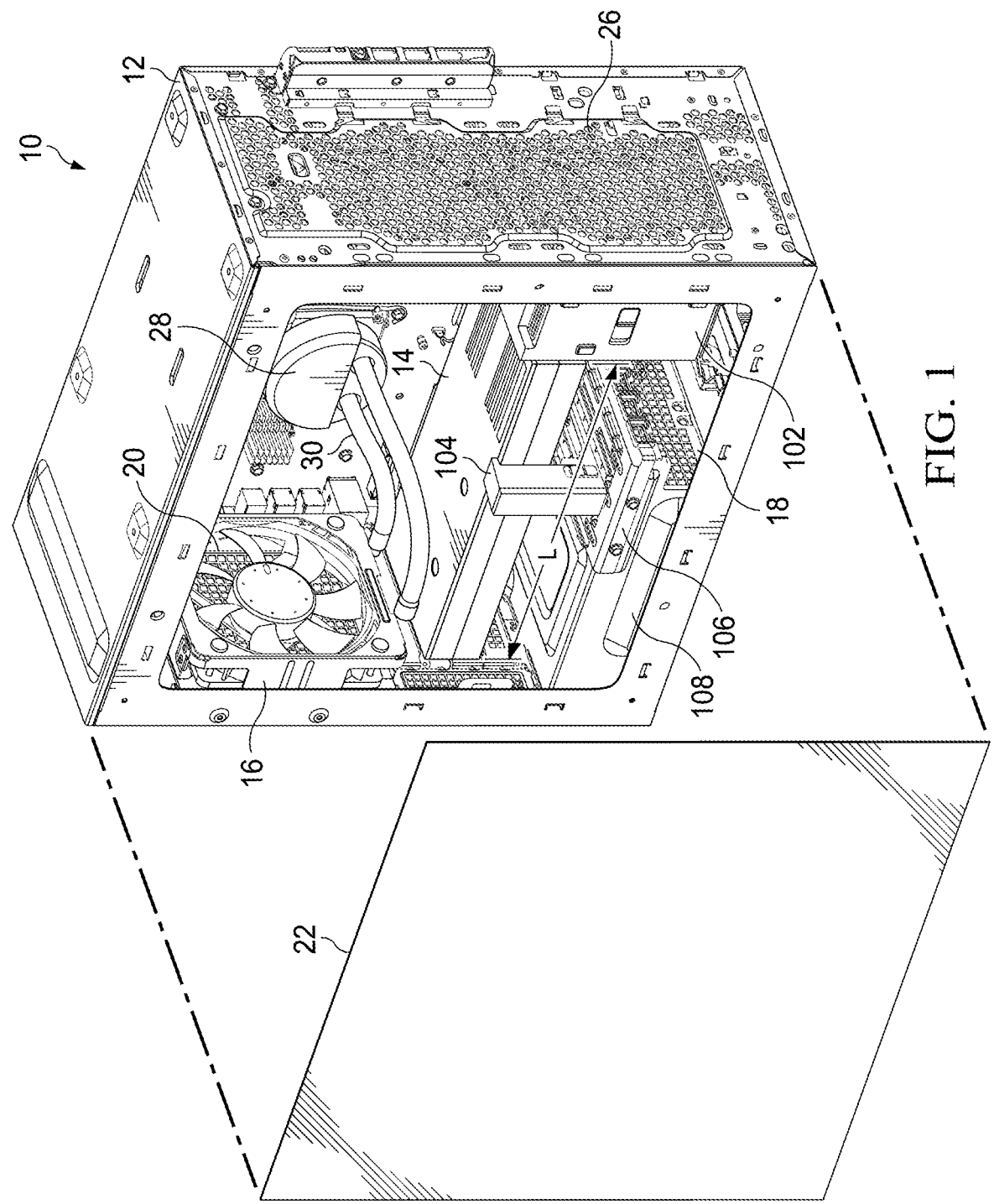
FIG. 1 is a perspective view of a desktop chassis for an information handling system including one embodiment of a scalable graphics card assembly support system.

In the following description, details are set forth by way of example to facilitate discussion of the disclosed subject matter. It should be apparent to a person of ordinary skill in the field, however, that the disclosed embodiments are exemplary and not exhaustive of all possible embodiments.

For the purposes of this disclosure, an information handling system may include an instrumentality or aggregate of instrumentalities operable to compute, classify, process, transmit, receive, retrieve, originate, switch, store, display, manifest, detect, record, reproduce, handle, or utilize various forms of information, intelligence, or data for business, scientific, control, entertainment, or other purposes. For example, an information handling system may be a personal computer, a consumer electronic device, a network storage device, or another suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and one or more video displays. The information handling system may also include one or more buses operable to transmit communication between the various hardware components.

A processor subsystem may comprise a system, device, or apparatus operable to interpret and execute program instructions and process data, and may include a microprocessor, microcontroller, digital signal processor (DSP), application specific integrated circuit (ASIC), or another digital or analog circuitry configured to interpret and execute program instructions and process data. In some embodiments, a processor subsystem may interpret and execute program instructions and process data stored locally (e.g., in a memory subsystem). In the same or alternative embodiments, a processor subsystem may interpret and execute program instructions and process data stored remotely (e.g., in a network storage resource).

A system bus may refer to a variety of suitable types of bus structures, e.g., a memory bus, a peripheral bus, or a local bus using various bus architectures in selected embodiments. For example, such architectures may include, but are not limited to, Micro Channel Architecture (MCA) bus, Industry Standard Architecture (ISA) bus, Enhanced ISA (EISA) bus, Peripheral Component Interconnect (PCI) bus, PCI-Express bus, HyperTransport (HT) bus, and Video Electronics Standards Association (VESA) local bus.

A memory subsystem may comprise a system, device, or apparatus operable to retain and retrieve program instructions and data for a period of time (e.g., computer-readable media). A memory subsystem may comprise random access memory (RAM), electrically erasable programmable read-only memory (EEPROM), a PCMCIA card, flash memory, magnetic storage, opto-magnetic storage, and/or a suitable selection and/or array of volatile or non-volatile memory that retains data after power to its associated information handling system, such as system 100, is powered down.

In information handling systems 10, an I/O subsystem may comprise a system, device, or apparatus generally operable to receive and transmit data to or from or within information handling system 10. An I/O subsystem may represent, for example, a variety of communication interfaces, graphics interfaces, video interfaces, user input interfaces, and peripheral interfaces. In various embodiments, an I/O subsystem may be used to support various peripheral devices, such as a touch panel, a display adapter, a keyboard, a touch pad, or a camera, among other examples. In some implementations, an I/O subsystem may support so-called 'plug and play' connectivity to external devices, in which the external devices may be added or removed while information handling system 10 is operating.

A local storage resource may comprise computer-readable media (e.g., hard disk drive, floppy disk drive, CD-ROM, and other type of rotating storage media, flash memory, EEPROM, or another type of solid-state storage media) and may be generally operable to store instructions and data.

A network interface may be a suitable system, apparatus, or device operable to serve as an interface between information handling system 10 and a network (not shown). A network interface may enable information handling system 10 to communicate over a network using a suitable transmission protocol or standard. In some embodiments, a network interface may be communicatively coupled via a network to a network storage resource (not shown). A network coupled to a network interface may be implemented as, or may be a part of, a storage area network (SAN), personal area network (PAN), local area network (LAN), a metropolitan area network (MAN), a wide area network (WAN), a wireless local area network (WLAN), a virtual private network (VPN), an intranet, the Internet or another appropriate architecture or system that facilitates the communication of signals, data and messages (generally referred to as data). A network coupled to a network interface may transmit data using a desired storage or communication protocol, including, but not limited to, Fibre Channel, Frame Relay, Asynchronous Transfer Mode (ATM), Internet protocol (IP), other packet-based protocol, small computer system interface (SCSI), Internet SCSI (iSCSI), Serial Attached SCSI (SAS) or another transport that operates with the SCSI protocol, advanced technology attachment (ATA), serial ATA (SATA), advanced technology attachment packet interface (ATAPI), serial storage architecture (SSA), integrated drive electronics (IDE), or any combination thereof. A network coupled to a network interface or various components associated therewith may be implemented using hardware, software, or any combination thereof.

Each new generation of graphics cards for desktop computers draw more and more power to achieve higher levels of performance.

The increase in power requires larger and heavier thermal solutions on graphics card assemblies, which also requires higher wattage power supplies.

Graphics card assemblies incorporate a wide variety of thermal solutions, including both air-cooled (dual axial fans, triple axial fans, blowers, etc.) and liquid-cooled solutions, as well as a wide variety of air shrouds and cosmetic features that cause many graphics card assemblies to violate the PCIe CEM spec in height or width or both.

Turning to the FIGURES, FIG. 1 depicts a perspective view of an information handling system 10 contained in a chassis 12. Information handling system 10 may comprise components of a processor subsystem, a memory subsystem, an I/O subsystem, a local storage resource, and a network interface, which may be connected using cables and other components of a system bus. Chassis 12 comprises a plurality of panels 22, of which one or more are removable. Chassis 12 may be configured with a first fan 16 (not visible in FIG. 1) located by air inlet 26 on a first side and configured with vent 20 located on a second side opposite the first side. As depicted in FIG. 1, in some embodiments, a second fan 16 may be located next to vent 20. In some embodiments, a fan controller 28 may be connected to fan 16 via cables 30.

Information handling system 10 depicted in FIG. 1 depicts a basic information handling system. However, additional components may be present. For example, information handling system 10 may comprise two or more graphics card assemblies 14 and multiple fans 16 and may further include lights or other text, logos, art or visual effects for a desired aesthetic appearance.

As depicted in FIG. 1, chassis 12 may be oriented such that power supply unit 18 is located at the bottom of chassis 12, fan 16 is located near the top of chassis 12 and graphics card assembly 14 is oriented relative to a horizontal plane.

Packing Material Often Installed in Chassis for Protecting Components During Transport When information handling system 10 is shipped, panel 22 is installed after packing material (e.g. air-filled bubbles—not shown) is temporarily installed in chassis 12 to protect components. The packing material will interfere with airflow through chassis 12, so the packing material must be removed before information handling system 10 is delivered to a user. This requires a technician to remove panel 22, carefully remove all packing material and reinstall panel 22. The packing material is often thrown away, adding to landfills. If a user wants to transport information handling system 10, such as to a gaming event, and the user wants to ensure the components are protected, the packing material may be reinstalled in chassis 12 to protect the components but would need to be removed at the event. This requires the user to save the packing material.

Chassis Visibility

If chassis 12 is formed with opaque panels 22, it is possible that nobody will see the inside of chassis 12. There are some users, particularly gamers who take pride in their information handling systems 10, who may want others to be able to see inside chassis 12. Thus, in some chassis 12, at least one panel 22 is clear to allow people to view inside chassis 12.

Graphics Card Assemblies can Sag Depending on Orientation

Graphics card assembly 14 may comprise a printed circuit board (PCB) configured with a graphics processing unit (GPU) and additional components. If graphics card assembly 14 is oriented in a vertical plane (the PCB is on an edge), the PCB has the structural properties to support the graphics card assembly and still be aesthetically pleasing. However, if the graphics card assembly is oriented in a horizontal plane (as depicted in FIG. 1), the PCB still has the structural properties to support other components of graphics card assembly 14 but the weight of graphics card assembly 14 can cause the graphics card to sag such that graphics card assembly 14 is aesthetically displeasing. Furthermore, even though a graphics card assembly may be manufactured such that sagging has no effect on GPU performance, users—particularly gamers who take pride in their information handling systems 10 and who want others to be able to see inside the chassis—may be concerned with a sagging graphics card assembly.

Embodiments disclosed herein include an information handling system 10 with a scalable system for supporting one or more graphics card assemblies 14 at the end and/or side of graphics card assembly 14. The system may be installed by a manufacturer such that packing material is not needed to protect components during shipping. Furthermore, embodiments may add to the aesthetic appearance of the inside of chassis 12 such that a user might not remove the graphics card assembly support system.

Embodiments disclosed herein are described with respect to information handling systems 10 contained within desktop chassis 12. Particular embodiments are best understood by reference to FIGS. 1-7, wherein like numbers are used to indicate like and corresponding parts.

End Support

Figure 2:
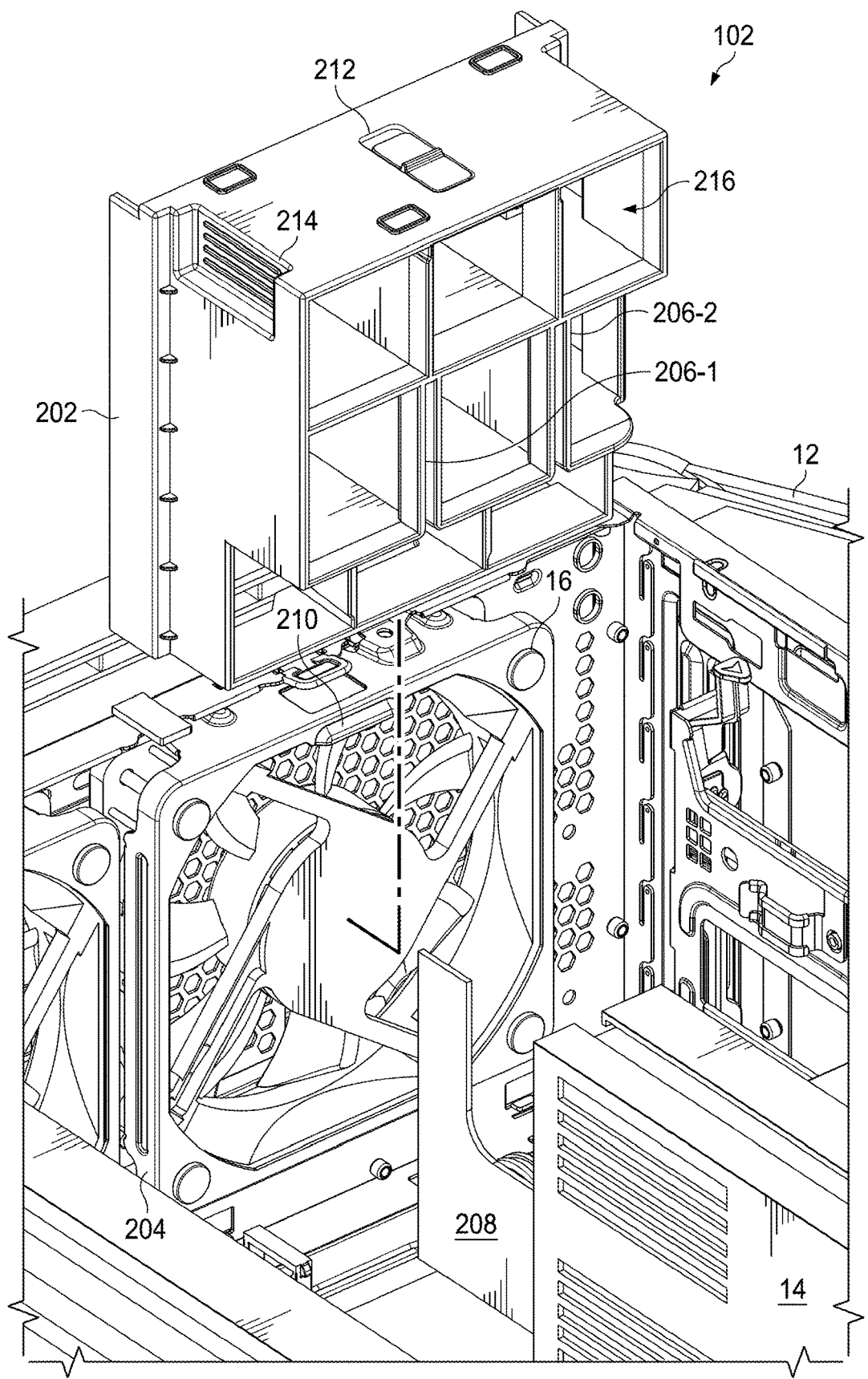
FIG. 2 is a perspective partial view of one embodiment of an end support of a scalable graphics card assembly support system in a desktop chassis of an information handling system.
Figure 3:
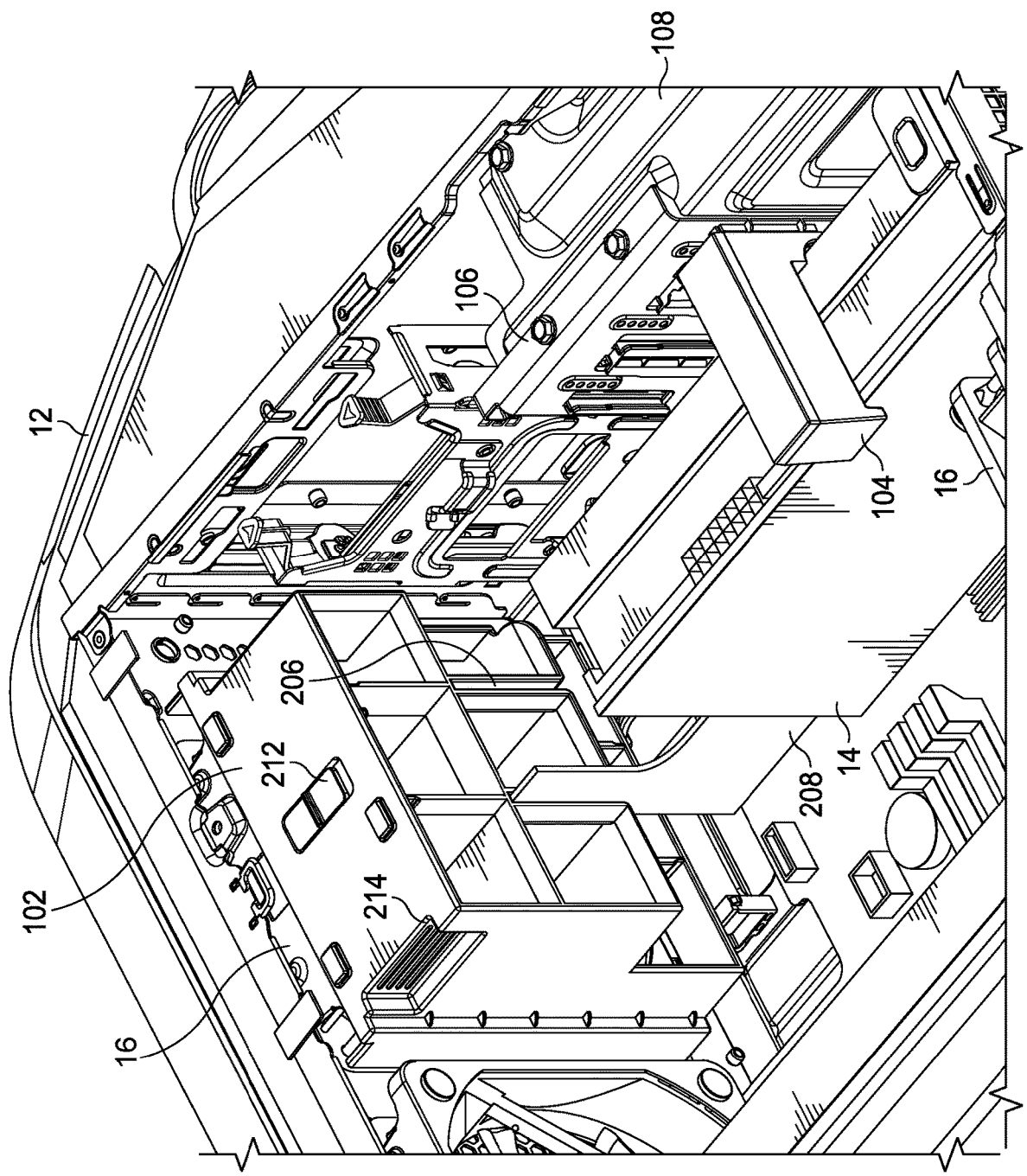
FIG. 3 is a perspective view of one embodiment of a scalable graphics card assembly support system comprising an end support and a side support retaining a graphics card assembly inside a desktop chassis of an information handling system.

Referring to FIGS. 2-3, end support 102 may be coupled to a fan 16. End support 102 may wrap around and engage a portion of fan 16. In some embodiments, end support 102 comprises side rails 202 for engaging flanges 204 on the sides of fan 16, wherein end support 102 may engage fan 16 by translating relative to fan 16 when side rails 202 are positioned over flanges 204. End support 102 may further include latch 212 configured for engaging a retention feature 210 on fan 16 such that, when end support 102 is positioned with side rails 202 engaged with flanges 204 on fan 16, latch 212 maintains the position of end support 102 relative to fan 16. Slider 212 may be configured as a sliding mechanism to enable a person to disengage latch 212 to install or remove end support 102 without tools. End support 102 may include contact areas 214 to allow a user to grip end support 102 for easier installation and removal of end support 102 from chassis 12.

End support 102 further comprises one or more slots 206 for receiving graphics card assembly 14 or extender 208 coupled to graphics card assembly 14. As depicted in FIG. 3, extender 208 of graphics card assembly 14 may be installed in slot 206-1, wherein slot 206-2 may couple to a second graphics card assembly 14 or extender 208 (not shown).

Referring to FIG. 2, embodiments of a graphics card assembly support system may comprise end support 102. In some embodiments, embodiments of a graphics card assembly support system may be configured to support a graphics card assembly using only end support 102.

As depicted in FIGS. 2-3, end support 102 may be configured with a plurality of ducts 216 such that airflow from fan 16 is directed toward graphics card assembly 14. If end support 102 is not installed, airflow from fan 16 may disperse more rapidly such that less airflow passes by graphics card assembly 14. The shape and length of ducts 216 ensures airflow bypasses other components that may not need as much cooling and a greater volume of cool airflow flows past graphics card assembly 14.

Side Support

Figure 4:
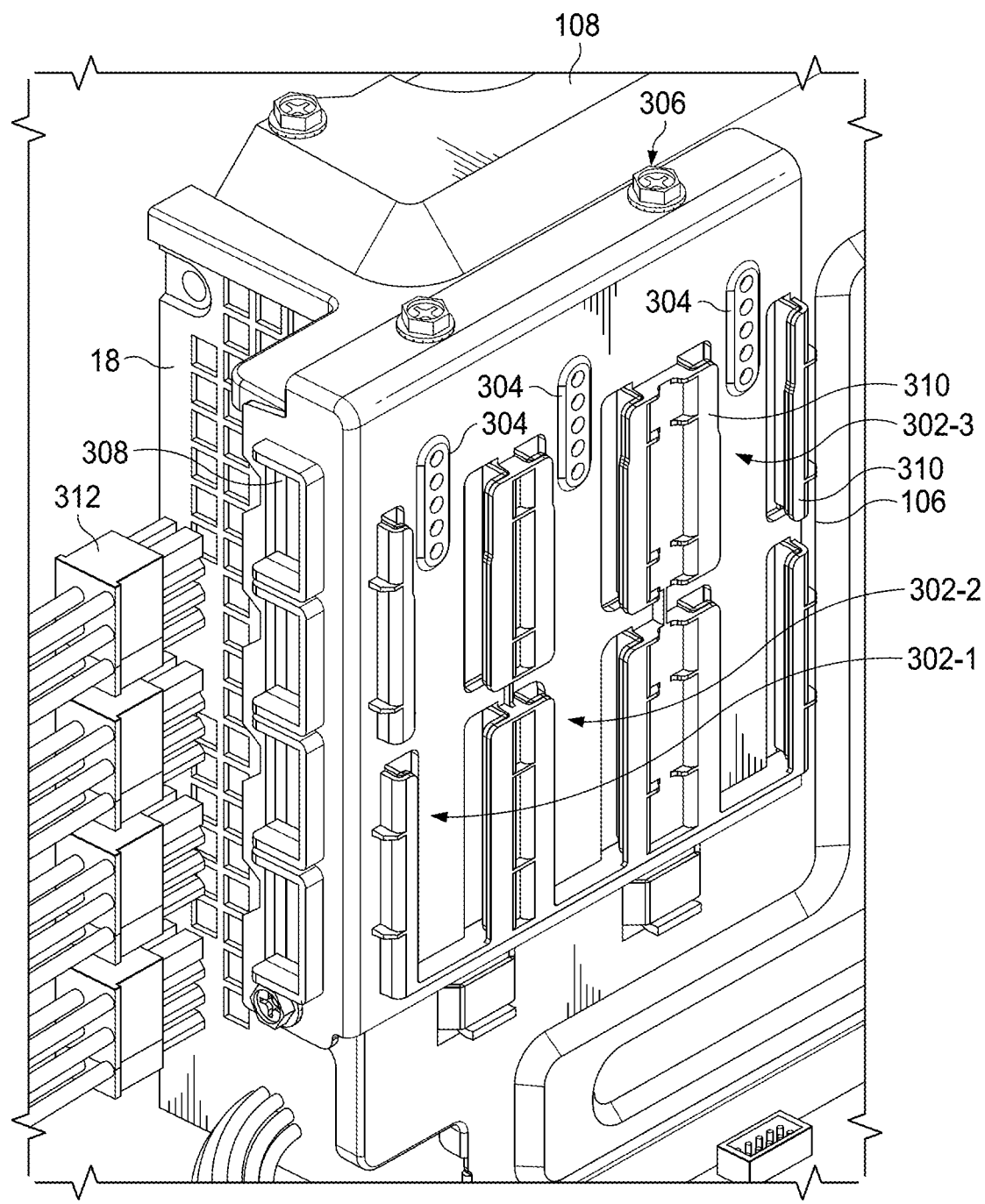
FIG. 4 is a perspective view of one embodiment of a retention guide of a scalable graphics card assembly support system inside a desktop chassis of an information handling system.

Referring to FIGS. 1, 3 and 4, end support 102 may engage a first end of graphics card assembly 14 or extender 208 coupled to graphics card assembly 14 and side support 104 may engage graphics card assembly 14 at a position along the length (L) of graphics card assembly 14. Side support 104 may be coupled to retention guide 106 and retention guide 106 may be coupled to shroud 108.

Referring to FIG. 4, retention guide 106 comprises a plurality of side support positions 302 in which side support 104 may be selectively positioned relative to the length (L) of graphics card assembly 14, wherein each side support position 302 comprises a set of retaining features 310 and a set of retention openings 304. Retaining features 310 may allow a user to slide end support 104 in or out of retention guide 106. Retention features 310 may be configured to engage side support 104 to oppose a moment generated by a force on a cantilevered portion of side support 104 during a shock event, thus eliminating the need for additional support from panel 22.

A plurality of retention openings 304 in each set of retention openings 304 allow a user to selectively engage side support 104 in a specific retention opening 304 in retention guide 106 to accommodate graphics card assembly 14 of different heights, discussed in greater detail below.

Retention guide 106 may include cable parking ports 308. Cable parking ports 308 may allow a user to insert ends of cables 312 when cables 312 are not being used, including when information handling system 10 is being serviced or some other reason. Cable parking ports 308 may be configured to receive cables 312 with different connection types or each cable parking port 308 may be configured for a particular connection type of cable 312.

Retention guide 106 may be coupled to shroud 108 using common hardware 306 or hardware that allows a user to install or remove retention guide 106 without tools.

Shroud 108 may be coupled to chassis 12 or a component in chassis 12. As depicted in FIG. 4, shroud 108 may be coupled to power supply unit 18 such that retention guide 106 does not couple to chassis 12. In these embodiments, panel 22 may be removed to access chassis 12 without requiring a user to remove additional hardware. Furthermore, shroud 108 may hide components inside chassis 12 that a user might not want others to see or shield one or more components from other components.

Figure 5:
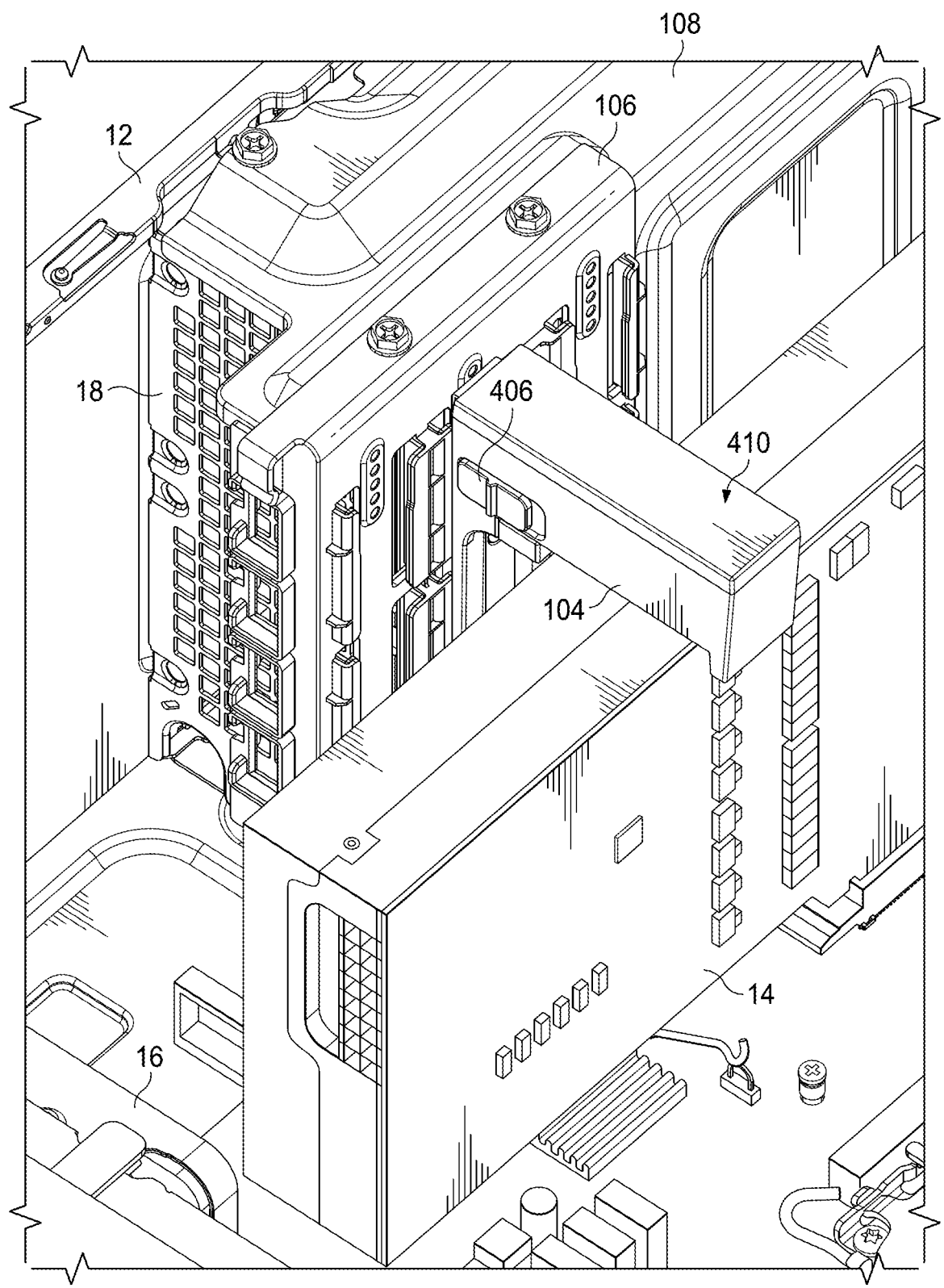
FIG. 5 is a perspective view of one embodiment of a side support of a scalable graphics card assembly support system inside a desktop chassis of an information handling system.
Figure 6:
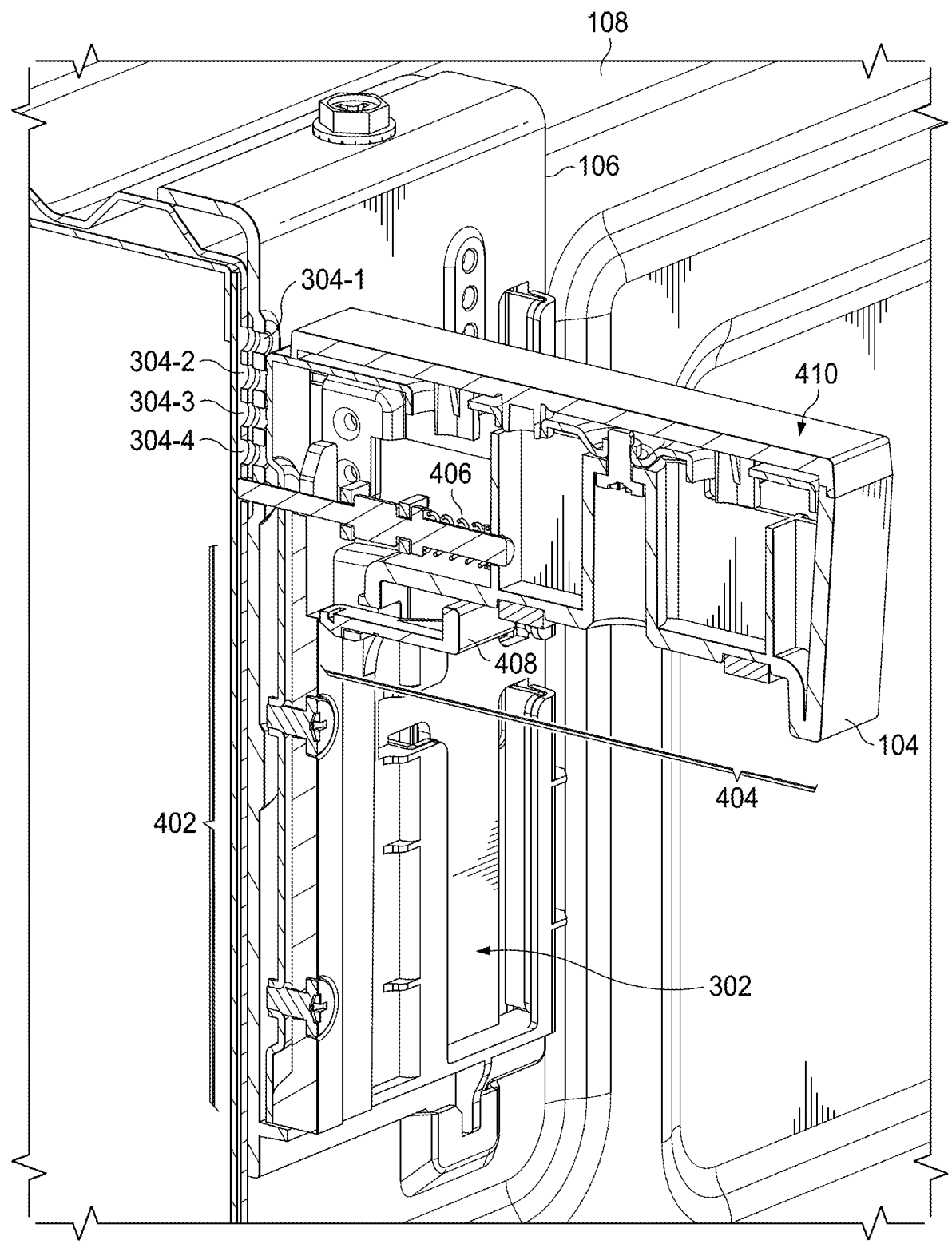
FIG. 6 is a cutaway perspective view of one embodiment of a side support of a scalable graphics card assembly support system inside a desktop chassis of an information handling system.

Referring to FIGS. 5 and 6, graphics card assembly 14 may be positioned in chassis 12 relative to fan 16 and side support 104 may be slidably coupled to retention guide 106 to engage graphics card assembly 14 such that graphics card assembly 14 is supported.

Referring to FIG. 5, in some configurations, only side support 104 is installed in chassis 12 to support graphics card assembly 14. For example, a user may determine that side support 104 provides enough structural support to graphics card assembly 14 to prevent sagging such that end support 102 is not necessary and also prefer the aesthetic appearance of chassis 12 without end support 102 or extender 208.

Accommodating Graphics Card Assemblies of Various Lengths

Retention guide 106 supports side support 104 at any of multiple horizontal positions to accommodate various graphics card assembly lengths and thermal solution types (e.g., blower, dual axial fan, triple axial fan, etc.).

Accommodating Graphics Card Assemblies of Various Heights

In some embodiments, side support 104 may be configured with retainer 406 configured for engaging one or more retention openings 304 for accommodating a height (represented by bracket 402) of graphics card assembly 14. As depicted in FIG. 6, side support 104 may be positioned with retainer 406 engaged in retention opening 304-4. However, if graphics card assembly 14 has a greater height 402, side support 104 may be positioned with retainer 406 engaged in one of retention openings 304-1 to 304-3. Retainer 406 may be configured such that a user can engage or disengage retainer without needing tools. For example, retainer 406 may be implemented as spring-loaded lock pin, wherein the spring maintains retainer 406 in retention opening 304 and a user can disengage retainer 406 from retention opening 304 using a user thumb or finger.

Accommodating Graphics Card Assemblies of Various Thicknesses

In some embodiments, side support 104 may have a base width (represented by bracket 404) for accommodating a range of graphics card assembly thicknesses and may include adapter 408 for accommodating graphics card assemblies 14 having smaller thicknesses. In some embodiments, adapter 408 may be inserted into side support 104 to accommodate graphics card assembly 14 having a smaller thickness or removed from side support 104 to accommodate graphics card assembly 14 having a larger thickness. In some embodiments, adapter 408 may be installed and removed without requiring tools.

In some embodiments, surface 410 of side support 104 may be flat and blank as depicted in FIGS. 1, 3, 5 and 6. In other embodiments, surface 410 may have a logo, text or art.

Figure 7:
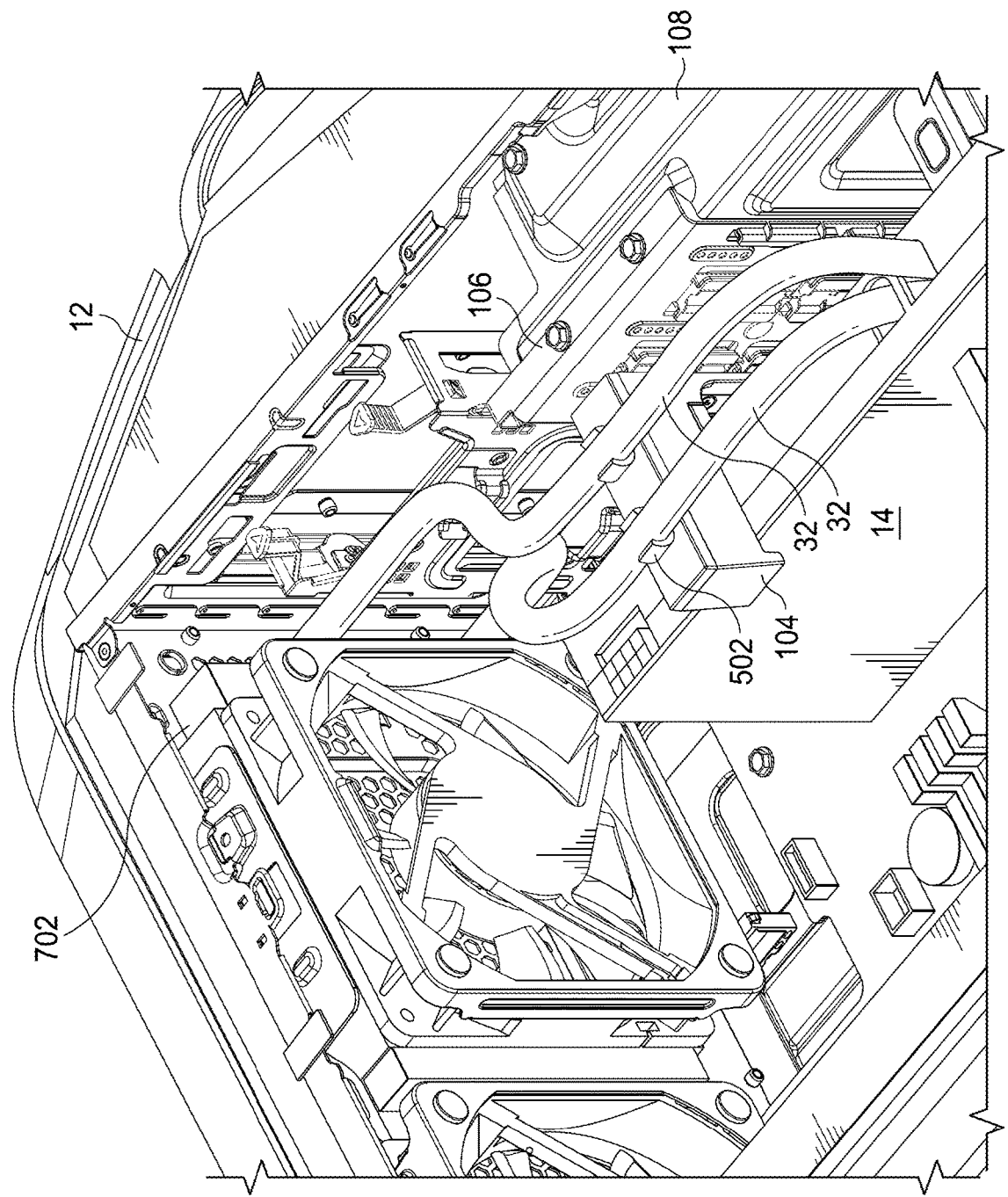
FIG. 7 is a perspective view of one embodiment of a scalable graphics card assembly support system retaining a graphics card assembly and managing liquid cooling conduits inside a desktop chassis for an information handling system.

Referring to FIG. 7, some information handling systems 10 may include liquid cooling systems with a chiller 702 either integral with fan 16 or positioned next to fan 16. Liquid from chiller 702 may flow through conduits 32 into graphics card assembly 14 for removing heat from graphics card assembly 14.

In some embodiments, side support 104 may include conduit couplers 502 for supporting conduits 32. Conduit couplers 502 may be oriented and configured to ensure conduits 32 do not bend or develop kinks and do not touch one or more components, cables or structures in chassis 12 or interfere with airflow through chassis 12. For example, as depicted in FIG. 7, conduit couplers 502 may be configured to ensure conduits 32 are aligned in the airflow to minimize disruption of the airflow over graphics card assembly 14.

Embodiments described herein may be installed to support one or more graphics card assemblies 14 of various lengths, heights and thicknesses, without coupling to a panel 22.

The above disclosed subject matter is to be considered illustrative, and not restrictive, and the appended claims are intended to cover all such modifications, enhancements, and other embodiments which fall within the true spirit and scope of the disclosure. Thus, to the maximum extent allowed by law, the scope of the disclosure is to be determined by the broadest permissible interpretation of the following claims and their equivalents, and shall not be restricted or limited by the foregoing detailed description.

What is claimed is:

1. A graphics card assembly support system for a chassis of an information handling system, the chassis comprising a fan positioned on a first side and configured for generating an airflow through the chassis to a vent on a second side opposite the first side, the graphics card assembly support system comprising:
    an end support configured for engaging the fan, the end support comprising:
    a slot for receiving a first end of a graphics card assembly, the graphics card assembly extending a length from the first end to a second end; and
    a plurality of channels for directing the airflow from the fan along the length of the graphics card assembly;
    a side support for engaging the graphics card assembly at a position along the length of the graphics card assembly; and
    a retention guide comprising a plurality of retention openings, wherein the retention guide is configured for detachable coupling with the side support at a retention opening of the plurality of retention openings and further configured for attaching to the chassis.

2. The graphics card assembly support system of claim 1, further comprising a shroud configured for coupling to a power supply unit (PSU) and the chassis, wherein the retention guide is configured for coupling to the shroud.

3. The graphics card assembly support system of claim 1, wherein the retention guide comprises a set of cable receivers configured for retaining an end of one or more cables.

4. The graphics card assembly support system of claim 1, wherein the slot is configured for retaining an extension coupled to the graphics card assembly.

5. The graphics card assembly support system of claim 1, further comprising a liquid cooling system for cooling the graphics card assembly, wherein the graphics card assembly support system comprises a conduit coupler coupled to the chassis and configured for supporting a conduit of the liquid cooling system.

6. A chassis containing an information handling systems (IHS), the chassis comprising:
   a plurality of sides, wherein a first side comprises an air inlet, a second side opposite the first side comprises a vent, and a third side comprises a removable panel;
   a fan positioned in the chassis near the air inlet for generating an airflow through the chassis to the vent;
   a power supply unit (PSU); and
   a graphics card assembly support system comprising:
      an end support for engaging the fan, the end support comprising:
         a slot for receiving a first end of a graphics card assembly, the graphics card assembly extending a length from the first end to a second end; and
         a plurality of channels for directing the airflow from the fan along the length of the graphics card assembly; and
      a side support for engaging the graphics card assembly at a position along the length of the graphics card assembly; and
      a retention guide comprising a plurality of retention openings, wherein the retention guide is configured for detachable coupling with the side support at a retention opening of the plurality of retention openings and further configured for attaching to the chassis.

7. The chassis of claim 6, wherein the removable panel comprises clear material.

8. The chassis of claim 6, further comprising a shroud configured for coupling to the PSU, wherein the retention guide is configured for coupling to the shroud.

9. The chassis of claim 6, wherein the retention guide comprises a set of cable receivers configured for retaining an end of one or more cables.

10. The chassis of claim 6, wherein the slot is configured for retaining an extension coupled to the graphics card assembly.

11. The chassis of claim 6, further comprising a liquid cooling system for cooling the graphics card assembly, wherein the graphics card assembly support system comprises a conduit coupler coupled to the chassis and configured for supporting a conduit of the liquid cooling system.

12. An information handling system contained in a desktop chassis comprising a plurality of sides, wherein a first side comprises an air inlet, a second side opposite the first side comprises a vent and a third side comprises a removable panel, the information handling system comprising:
   a graphics card assembly;
   a power supply unit (PSU) for supplying electric power to the graphics card assembly;
   a fan positioned in the chassis near the air inlet for generating an airflow through the chassis to the vent to cool the graphics card assembly; and
   a graphics card assembly support system comprising:
      an end support for engaging the fan, the end support comprising:
         a slot for receiving a first end of the graphics card assembly, the graphics card assembly extending a length from the first end to a second end; and
         a plurality of channels for directing the airflow from the fan along the length of the graphics card assembly; and
      a side support for engaging the graphics card assembly at a position along the length of the graphics card assembly; and
      a retention guide comprising a plurality of retention openings, wherein the retention guide is configured for detachable coupling with the side support at a retention opening of the plurality of retention openings and further configured for attaching to the chassis.

13. The information handling system of claim 12, wherein the removable panel comprises at least partially clear material.

14. The information handling system of claim 12, further comprising a shroud configured for coupling to the PSU, wherein the retention guide is configured for coupling to the shroud.

15. The information handling system of claim 12, wherein the retention guide comprises a set of cable receivers configured for retaining an end of one or more cables.

16. The information handling system of claim 12, wherein the slot is configured for retaining an extension coupled to the graphics card assembly.

17. The information handling system of claim 12, further comprising a liquid cooling system for cooling the graphics card assembly, wherein the graphics card assembly support system comprises a conduit coupler coupled to the chassis and configured for supporting a conduit of the liquid cooling system.

* * * * *